(12) United States Patent
Sung et al.

(10) Patent No.: US 11,793,052 B2
(45) Date of Patent: Oct. 17, 2023

(54) DISPLAY DEVICE INCLUDING A SENSING ELECTRODE

(71) Applicants: SAMSUNG DISPLAY CO., LTD., Yongin-si (KR); SEOUL NATIONAL UNIVERSITY R&DB FOUNDATION, Seoul (KR)

(72) Inventors: Eunjin Sung, Yongin-si (KR); Jungsuek Oh, Seoul (KR); Kiseo Kim, Yongin-si (KR); Byeongjin Kim, Gumi-si (KR); Jeongtaek Oh, Seoul (KR); Sangrock Yoon, Hwaseong-si (KR)

(73) Assignees: SAMSUNG DISPLAY CO., LTD., Yongin-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 17/647,140

(22) Filed: Jan. 5, 2022

(65) Prior Publication Data
US 2022/0375997 A1 Nov. 24, 2022

(30) Foreign Application Priority Data
May 18, 2021 (KR) .......... 10-2021-0064203

(51) Int. Cl.
*H10K 59/40* (2023.01)
*G06F 3/041* (2006.01)
(Continued)

(52) U.S. Cl.
CPC .......... *H10K 59/40* (2023.02); *G06F 3/0412* (2013.01); *G06F 3/0446* (2019.05); *G06F 3/0448* (2019.05); *H10K 50/84* (2023.02)

(58) Field of Classification Search
CPC . H01L 27/323; H01L 51/5237; G06F 3/0412; G06F 3/0446; G06F 3/0448
See application file for complete search history.

(56) References Cited

U.S. PATENT DOCUMENTS

2018/0157355 A1 6/2018 Kim
2019/0095018 A1* 3/2019 Shin .................... H01L 51/5253
(Continued)

FOREIGN PATENT DOCUMENTS

KR 20180064625 6/2018
KR 101973742 4/2019
(Continued)

OTHER PUBLICATIONS

J. Park, S. Y. Lee, J. Kim, D. Park, W. Choi and W. Hong, "An Optically Invisible Antenna-on-Display Concept for Millimeter-Wave 5G Cellular Devices," in IEEE Transactions on Antennas and Propagation, vol. 67, No. 5, pp. 2942-2952, May 2019.
(Continued)

*Primary Examiner* — Amit Chatly
(74) *Attorney, Agent, or Firm* — F. CHAU & ASSOCIATES, LLC

(57) ABSTRACT

A display device includes a display panel, a sensing electrode disposed on the display panel, a transmission line disposed on the display panel and spaced apart from the sensing electrode, an insulating layer disposed on the sensing electrode and the transmission line, and a radiation electrode disposed on the insulating layer. A portion of the transmission line overlaps a portion of the radiation electrode when viewed in a plane.

20 Claims, 19 Drawing Sheets

(51) Int. Cl.
*G06F 3/044* (2006.01)
*H10K 50/84* (2023.01)

(56) References Cited

U.S. PATENT DOCUMENTS

| | | | |
|---|---|---|---|
| 2020/0067176 A1* | 2/2020 | Kim | H01Q 1/22 |
| 2020/0201470 A1 | 6/2020 | Oh et al. | |
| 2020/0212114 A1* | 7/2020 | Song | H01L 51/5253 |
| 2020/0227819 A1* | 7/2020 | Oh | H04M 1/026 |
| 2020/0266526 A1 | 8/2020 | Choi et al. | |
| 2021/0141426 A1* | 5/2021 | Kim | H01Q 1/38 |
| 2021/0247869 A1* | 8/2021 | Kim | G06F 3/04164 |

FOREIGN PATENT DOCUMENTS

| | | |
|---|---|---|
| KR | 20200071354 | 6/2020 |
| KR | 102190667 | 12/2020 |
| KR | 102190757 | 12/2020 |
| KR | 20200136358 | 12/2020 |
| KR | 20200144076 | 12/2020 |

OTHER PUBLICATIONS

W. Hong, S. Lim, S. Ko and Y. G. Kim, Optically invisible Antenna Integrated Within an OLED Touch Display Panel for IoT Applications, in IEEE Transactions on Antennas and Propagation, vol. 65, No. 7, pp.

K. K. So, B. -J. Chen and C. H. Chan, Microwave and Miliimeter-Wave MIMO Antenna Using Conductive ITO Film, in IEEE Access, vol. 8, pp. 207024-207033, 2020.

* cited by examiner

DISPLAY DEVICE INCLUDING A SENSING ELECTRODE

CROSS-REFERENCE TO RELATED APPLICATION

This U.S. non-provisional patent application claims priority under 35 U.S.C. § 119 to Korean Patent Application No. 10-2021-0064203, filed on May 18, 2021, the contents of which are hereby incorporated by reference in its entirety.

TECHNICAL FIELD

The present disclosure relates to a display device and, more specifically, to a display device including a sensing electrode.

DISCUSSION OF THE RELATED ART

Electronic devices that provide images to a user, such as a smart phone, a digital camera, a notebook computer, a navigation unit, and a smart television, include a display device that displays images. The display device generates the images and provides the images to the user through a display screen thereof. The display device includes a display panel including an array of pixels that together generate the images.

Electronic devices such as smartphones have been developed that include both a display device as well as various wireless communication technologies, such as a cellular transponder (e.g., LTE and/or 5G), Wi-Fi, and Bluetooth. In this case, one or more antennae are coupled to the display device to perform a communication function.

Each antenna may include a transmission line connected to a pad to transmit a signal and a radiation electrode to radiate the signal. Recently, as a thickness of the display device is slimmed, a distance between the radiation electrode and the display panel is reduced. In this case, parasitic capacitance between the radiation electrode and the display panel increases. When the parasitic capacitance increases, a radiation efficiency, gain characteristics, and a frequency bandwidth of the antenna are degraded.

SUMMARY

A display device includes a display panel, a sensing electrode disposed on the display panel, a transmission line disposed on the display panel and spaced apart from the sensing electrode, an insulating layer disposed on the sensing electrode and the transmission line, and a radiation electrode disposed on the insulating layer. A portion of the transmission line overlaps a portion of the radiation electrode when viewed in a plane (i.e., in a plan view).

A display device includes a display panel, a sensing electrode disposed on the display panel, a transmission line disposed on the display panel and spaced apart from the sensing electrode, an insulating layer disposed on the sensing electrode and the transmission line, and a radiation electrode disposed on the insulating layer. The transmission line includes a first transmission line extending in a first direction and overlapping the radiation electrode and a second transmission line extending along a second direction, crossing the first direction, from a portion of the first transmission line to outside of the radiation electrode. The first transmission line has a length that is equal to a length of the radiation electrode in the first direction.

A display device includes a display panel, a sensing electrode disposed on the display panel, and an antenna disposed proximate to the display panel. The antenna includes a transmission line, a radiation electrode, and an insulating layer disposed between the transmission line and the insulating layer. The insulating layer may be disposed on the sensing electrode. A portion of the transmission line may overlap a portion of the radiation electrode.

BRIEF DESCRIPTION OF THE DRAWINGS

The above and other aspects of the present disclosure will become readily apparent by reference to the following detailed description when considered in conjunction with the accompanying drawings, wherein.

DETAILED DESCRIPTION

Figure 1:
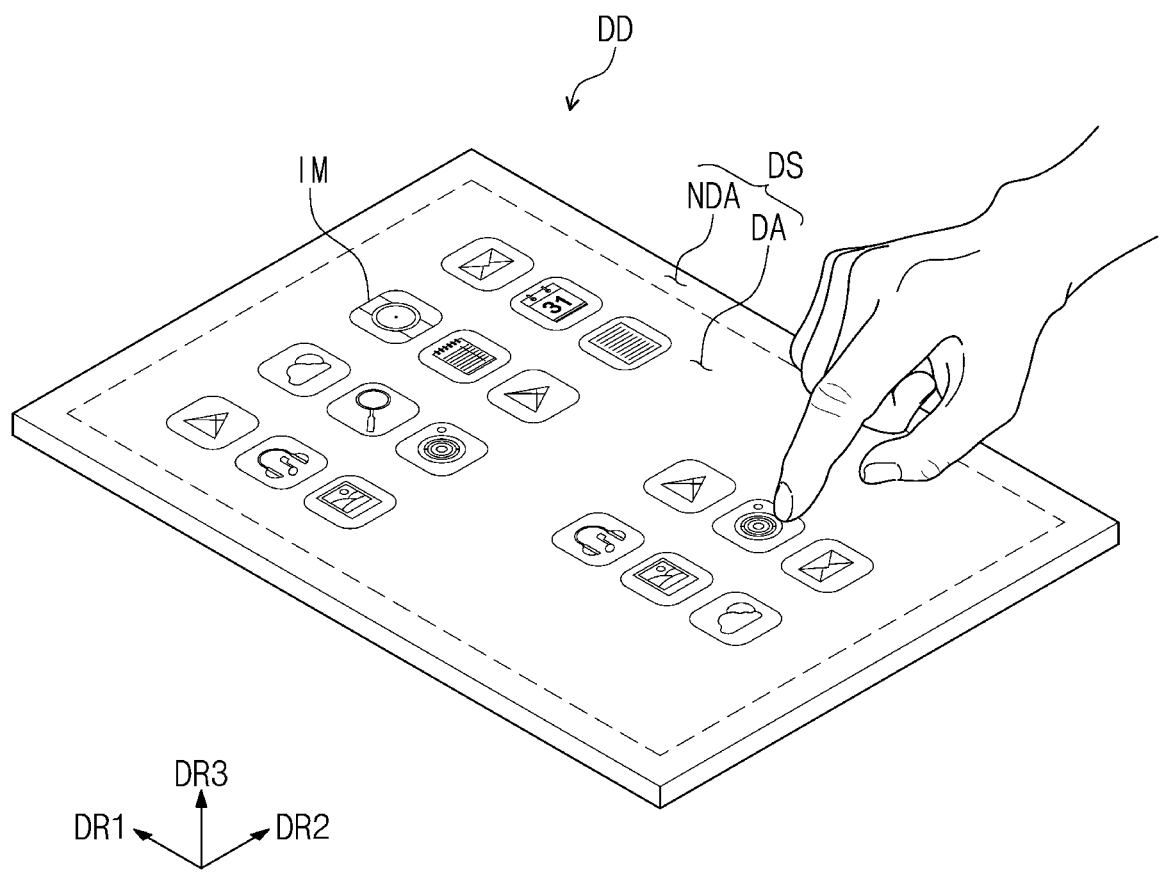
FIG. 1 is a perspective view showing a display device according to an embodiment of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout the specification and the drawings. In the drawings, the thickness, ratio, and dimension of components may be exaggerated for effective description of the technical content.

As used herein, the term "and/or" includes any and all combinations of one or more of the associated listed items.

It will be understood that, although the terms first, second, etc. may be used herein to describe various elements, these elements should not necessarily be limited by these terms. These terms are used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes," "including," "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

FIG. 1 is a perspective view showing a display device DD according to an embodiment of the present disclosure.

Referring to FIG. 1, the display device DD may have substantially a rectangular shape defined by two long sides extending in a first direction DR1 and two short sides extending in a second direction DR2 crossing the first direction DR1. However, the shape of the display device DD should not necessarily be limited to the rectangular shape, and the display device DD may have various shapes, such as a circular shape and a polygonal shape.

Hereinafter, a direction substantially perpendicular to a plane defined by the first direction DR1 and the second direction DR2 may be referred to as a "third direction DR3". In the present disclosure, the expression "when viewed in a plane" may mean a state of being viewed from the third direction DR3.

An upper surface of the display device DD may be referred to as a display surface DS and may be a planar surface defined by the first direction DR1 and the second direction DR2. Images IM generated by the display device DD may be provided to a user through the display surface DS.

The display surface DS may include a display area DA and a non-display area NDA proximate to and at least partially surrounding the display area DA. The display area DA may display the images, and the non-display area NDA might not display the images. The non-display area NDA may at least partially surround the display area DA and may define an edge of the display device DD, which is printed by a predetermined color.

The display device DD may be applied to a large-sized electronic device, such as a television set, a computer monitor, or an outdoor digital billboard, and a small and medium-sized electronic device, such as a personal computer (PC), a notebook computer, a personal digital assistant (PDA), a car navigation unit, a game console, a smartphone, a tablet computer, and a camera. However, these are merely examples, and thus, the display device DD may be applied to other electronic devices.

Figure 2:
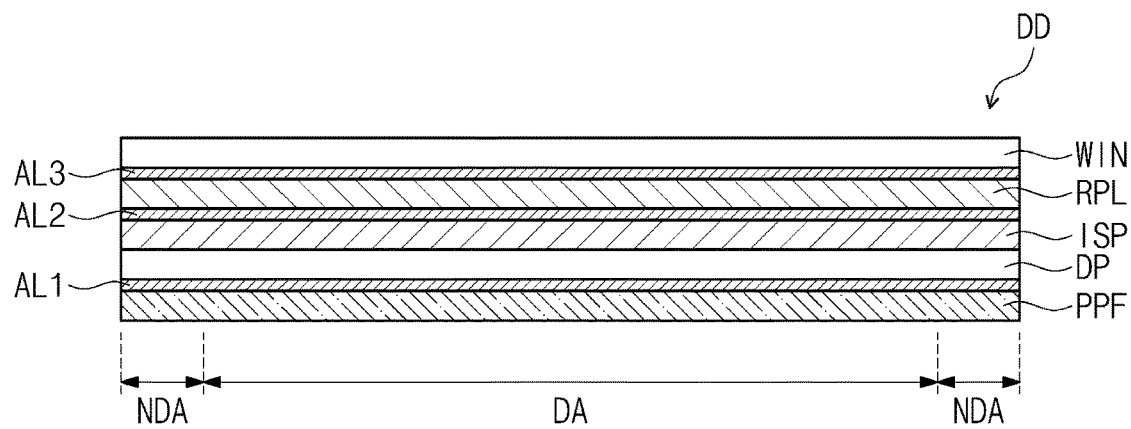
FIG. 2 is a cross-sectional view showing the display device shown in FIG. 1.
Figure 2:
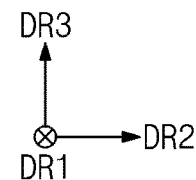

FIG. 2 is a cross-sectional view showing the display device DD shown in FIG. 1.

FIG. 2 shows a cross-section of the display device DD when viewed in the first direction DR1.

Referring to FIG. 2, the display device DD may include a display panel DP, an input sensing unit ISP, an anti-reflective layer RPL, a window WIN, a panel protective film PPF, and first, second, and third adhesive layers AL1, AL2, and AL3.

The display panel DP may be a flexible display panel that is capable of being bent or flexed to a noticeable degree without cracking or otherwise breaking. The display panel DP may be a light-emitting type display panel, however, the present disclosure is not necessarily limited thereto. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, the organic light emitting display panel will be described as a representative example of the display panel DP.

The input sensing unit ISP may be disposed on the display panel DP. The input sensing unit ISP may include a plurality of sensing portions sensing an external input by a capacitive method. The input sensing unit ISP may be manufactured directly on the display panel DP when the display device DD is manufactured, however, the present disclosure is not necessarily limited thereto or thereby. According to an embodiment of the present disclosure, the input sensing unit ISP may be attached to the display panel DP by an adhesive layer after being manufactured separately from the display panel DP.

The anti-reflective layer RPL may be disposed on the input sensing unit ISP. The anti-reflective layer RPL may be defined as an external light reflection preventing film. The anti-reflective layer RPL may reduce a reflectance of an external light incident to the display panel DP from the above of the display device DD.

In a case where the external light incident to the display panel DP is reflected back to the user after reaching the display panel DP, the user may perceive the external light. The anti-reflective layer RPL may include a plurality of color filters that displays the same colors as pixels to prevent the above-mentioned phenomenon.

The color filters may filter the external light to allow the external light to have the same color as the pixels. In this case, the external light might not be perceived by the user, however, the present disclosure should not necessarily be limited thereto or thereby. According to an embodiment of the present disclosure, the anti-reflective layer RPL may include a retarder and/or a polarizer to reduce the reflectance of the external light.

The window WIN may be disposed on the anti-reflective layer RPL. The window WIN may protect the display panel DP, the input sensing unit ISP, and the anti-reflective layer RPL from external scratches and impacts.

The panel protective film PPF may be disposed under the display panel DP. The panel protective film PPF may protect a lower portion of the display panel DP. The panel protective film PPF may include a flexible plastic material such as polyethylene terephthalate (PET).

The first adhesive layer AL1 may be disposed between the display panel DP and the panel protective film PPF. The display panel DP and the panel protective film PPF may be coupled to each other by the first adhesive layer AL1. The second adhesive layer AL2 may be disposed between the anti-reflective layer RPL and the input sensing unit ISP. The anti-reflective layer RPL and the input sensing unit ISP may be coupled to each other by the second adhesive layer AL2. The third adhesive layer AL3 may be disposed between the window WIN and the anti-reflective layer RPL. The window WIN and the anti-reflective layer RPL may be coupled to each other by the third adhesive layer AL3.

Figure 3:
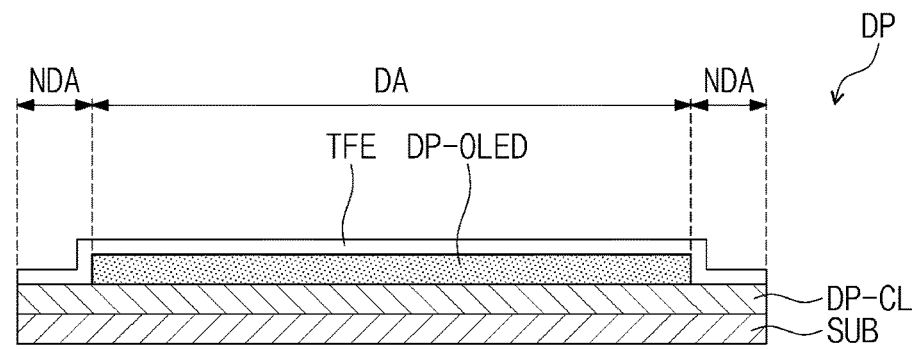
FIG. 3 is a cross-sectional view showing a display panel shown in FIG. 2.
Figure 3:
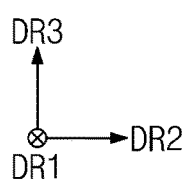

FIG. 3 is a cross-sectional view showing the display panel DP shown in FIG. 2.

FIG. 3 shows a cross-section of the display panel DP when viewed in the first direction DR1.

Referring to FIG. 3, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include the display area DA and the non-display area NDA around the display area DA. The substrate SUB may include a glass material or a flexible plastic material such as polyimide (PI). The display element layer DP-OLED may be disposed in the display area DA.

A plurality of pixels may be disposed in the circuit element layer DP-CL and the display element layer DP-OLED. Each pixel thereof may include a transistor disposed on the circuit element layer DP-CL and a light emitting element disposed on the display element layer DP-OLED and connected to the transistor. The pixel is described in greater detail below.

The thin film encapsulation layer TFE may be disposed on the circuit element layer DP-CL and may cover the display element layer DP-OLED. The thin film encapsulation layer TFE may protect the pixels from moisture, oxygen, and foreign substances.

Figure 4:
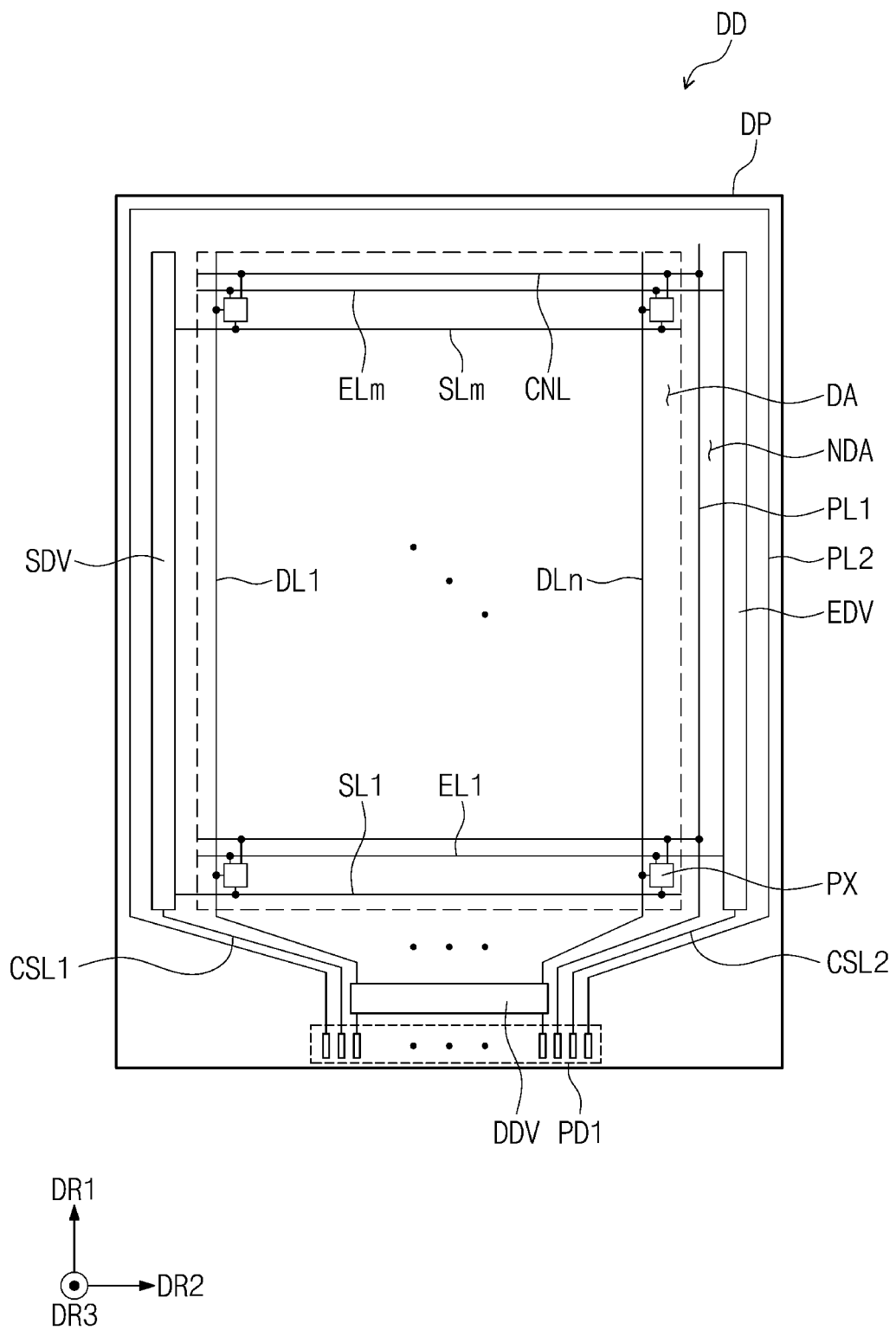
FIG. 4 is a plan view showing the display panel shown in FIG. 2.

FIG. 4 is a plan view showing the display panel DP shown in FIG. 2.

Referring to FIG. 4, the display device DD may include the display panel DP, a scan driver SDV, a data driver DDV, an emission driver EDV, and a plurality of first pads PD1.

The display panel DP may have a rectangular shape having two long sides extending in the first direction DR1 and two short sides extending in the second direction DR2, however, the shape of the display panel DP should not necessarily be limited thereto or thereby. The display panel DP may include the display area DA and the non-display area NDA proximate to and at least partially surrounding the display area DA.

The display panel DP may include a plurality of pixels PX, a plurality of scan lines SL1 to SLm, a plurality of data lines DL1 to DLn, a plurality of emission lines EL1 to Elm, first and second control lines CSL1 and CSL2, first and second power lines PL1 and PL2, and connection lines CNL. Each of "m" and "n" is a positive integer.

The pixels PX may be arranged in the display area DA. The scan driver SDV and the emission driver EDV may be disposed in the non-display area NDA respectively adjacent to the long sides of the display panel DP. The data driver DDV may be disposed in the non-display area NDA, adjacent to one short side of the short sides of the display panel DP. When viewed in a plane, the data driver DDV may be adjacent to a lower end of the display panel DP.

The scan lines SL1 to SLm may extend in the second direction DR2 and may be connected to the pixels PX and the scan driver SDV. The data lines DL1 to DLn may extend in the first direction DR1 and may be connected to the pixels PX and the data driver DDV. The emission lines EL1 to ELm may extend in the second direction DR2 and may be connected to the pixels PX and the emission driver EDV.

The first power line PL1 may extend in the first direction DR1 and may be disposed in the non-display area NDA. The first power line PL1 may be disposed between the display area DA and the emission driver EDV, however, the present disclosure is not necessarily limited thereto or thereby. According to an embodiment of the present disclosure, the first power line PL1 may be disposed between the display area DA and the scan driver SDV.

The connection lines CNL may extend in the second direction DR2 and may be arranged in the first direction DR1. The connection lines CNL may be connected to the first power line PL1 and the pixels PX. A first voltage may be applied to the pixels PX through the first power line PL1 and the connection lines CNL connected to the first power line PL1.

The second power line PL2 may be disposed in the non-display area NDA. The second power line PL2 may extend along the long sides of the display panel DP and the other short side at which the data driver DDV is not disposed in the display panel DP. The second power line PL2 may be disposed outside of the scan driver SDV and the emission driver EDV.

The second power line PL2 may extend to the display area DA and may be connected to the pixels PX. A second voltage having a level lower than that of the first voltage may be applied to the pixels PX through the second power line PL2.

The first control line CSL1 may be connected to the scan driver SDV and may extend toward the lower end of the display panel DP when viewed in a plane. The second control line CSL2 may be connected to the emission driver EDV and may extend toward the lower end of the display panel DP when viewed in a plane. The data driver DDV may be disposed between the first control line CSL1 and the second control line CSL2.

The first pads PD1 may be disposed in the non-display area NDA adjacent to the lower end of the display panel DP. The first pads PD1 may be disposed closer to the lower end of the display panel DP than the data driver DDV is. The data driver DDV, the first power line PL1, the second power line PL2, the first control line CSL1, and the second control line CSL2 may be connected to the first pads PD1. The data lines DL1 to DLn may be connected to the data driver DDV, and the data driver DDV may be connected to the first pads PD1 corresponding to the data lines DL1 to DLn.

The display device DD may further include a timing controller controlling an operation of the scan driver SDV, the data driver DDV, and the emission driver EDV and a voltage generator generating the first and second voltages. The timing controller and the voltage generator may be connected to corresponding first pads PD1 through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

The pixels PX may receive the data voltages in response to the scan signals. The pixels PX may emit a light having a luminance corresponding to the data voltages in response to the emission signals, and thus, the image may be displayed.

Figure 5:
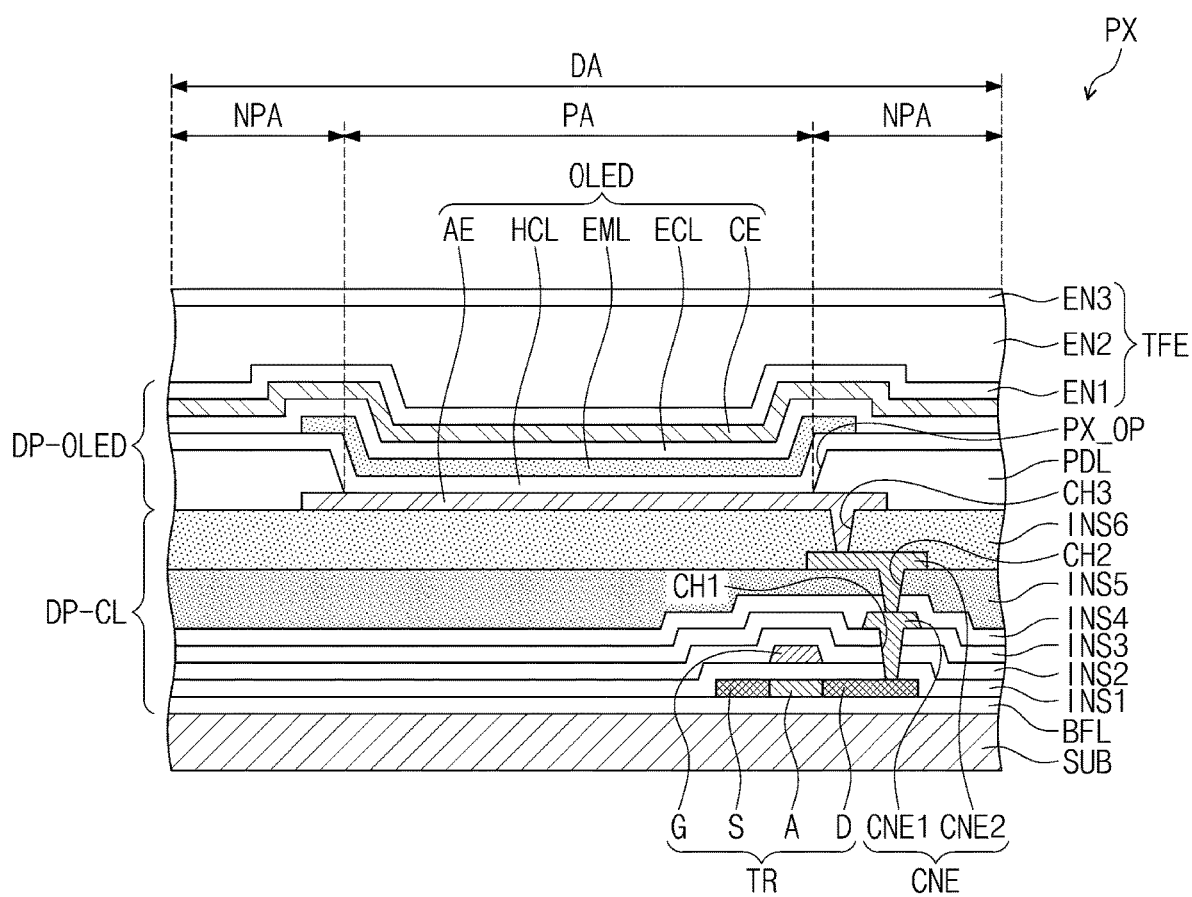
FIG. 5 is a cross-sectional view showing a pixel shown in FIG. 4.

FIG. 5 is a cross-sectional view showing a pixel PX shown in FIG. 4.

Referring to FIG. 5, the pixel PX may include the transistor TR and the light emitting element OLED. The light emitting element OLED may include a first electrode (or an anode) AE, a second electrode (or a cathode) CE, a hole control layer HCL, an electron control layer ECL, and a light emitting layer EML.

The transistor TR and the light emitting element OLED may be disposed on the substrate SUB. As an example, one transistor TR is shown in FIG. 5, however, the pixel PX may include a plurality of transistors and at least one capacitor driving the light emitting element OLED.

The display area DA may include a light emitting area PA corresponding to each pixel PX and a non-light-emitting area NPA around the light emitting area PA. The light emitting element OLED may be disposed in the light emitting area PA.

A buffer layer BFL may be disposed on the substrate SUB, and the buffer layer BFL may be an inorganic layer. A semiconductor pattern may be disposed on the buffer layer BFL. The semiconductor pattern may include polycrystalline silicon, amorphous silicon, or metal oxide.

The semiconductor pattern may be doped with an N-type dopant or a P-type dopant. The semiconductor pattern may include a high-doped region and a low-doped region. The high-doped region may have a conductivity that is greater than that of the low-doped region and may substantially serve as a source and a drain of the transistor TR. The low-doped region may substantially correspond to an active (or a channel) of the transistor TR.

The source S, the active A, and the drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may include a first connection electrode CNE1 and a second connection electrode CNE2 connecting the transistor TR to the light emitting element OLED. The first connection electrode CNE1 may be disposed on the third insulating layer INS3 and may be connected to the drain D through a first contact hole CH1 defined through the first, second, and third insulating layers INS1, INS2, and INS3.

A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 through a second contact hole CH2 defined through the fourth insulating layer INS4 and the fifth insulating layer INS5.

A sixth insulating layer INS6 may be disposed on the second connection electrode CNE2. Each layer from the buffer layer BFL to the sixth insulating layer INS6 may be defined as the circuit element layer DP-CL. Each of the first to sixth insulating layers INS1 to INS6 may be an inorganic layer or an organic layer.

The first electrode AE may be disposed on the sixth insulating layer INS6. The first electrode AE may be connected to the second connection electrode CNE2 through a third contact hole CH3 defined through the sixth insulating layer INS6. A pixel definition layer PDL may be disposed on the first electrode AE and the sixth insulating layer INS6. The pixel definition layer PDL may be provided with an opening PX_OP defined therethrough and exposing a portion of the first electrode AE.

The hole control layer HCL may be disposed on the first electrode AE and the pixel definition layer PDL. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may generate light having one of red, green, and blue colors.

The electron control layer ECL may be disposed on the light emitting layer EML and the hole control layer HCL. The electron control layer ECL may include an electron transport layer and an electron injection layer. The hole control layer HCL and the electron control layer ECL may be commonly disposed in the light emitting area PA and the non-light-emitting area NPA.

The second electrode CE may be disposed on the electron control layer ECL. The second electrode CE may be commonly disposed over the pixels PX. A layer on which the light emitting element OLED is disposed may be referred to as the display element layer DP-OLED.

The thin film encapsulation layer TFE may be disposed on the second electrode CE and may cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may include an inorganic insulating layer and may protect the pixel PX from moisture and oxygen. The second encapsulation layer EN2 may include an organic insulating layer and may protect the pixel PX from a foreign substance such as dust particles.

The first voltage may be applied to the first electrode AE via the transistor TR, and the second voltage may be applied to the second electrode CE. Holes and electrons injected into the light emitting layer EML may be recombined to generate excitons, and the light emitting element OLED may emit light by the excitons that return to a ground state from an excited state.

Figure 6:
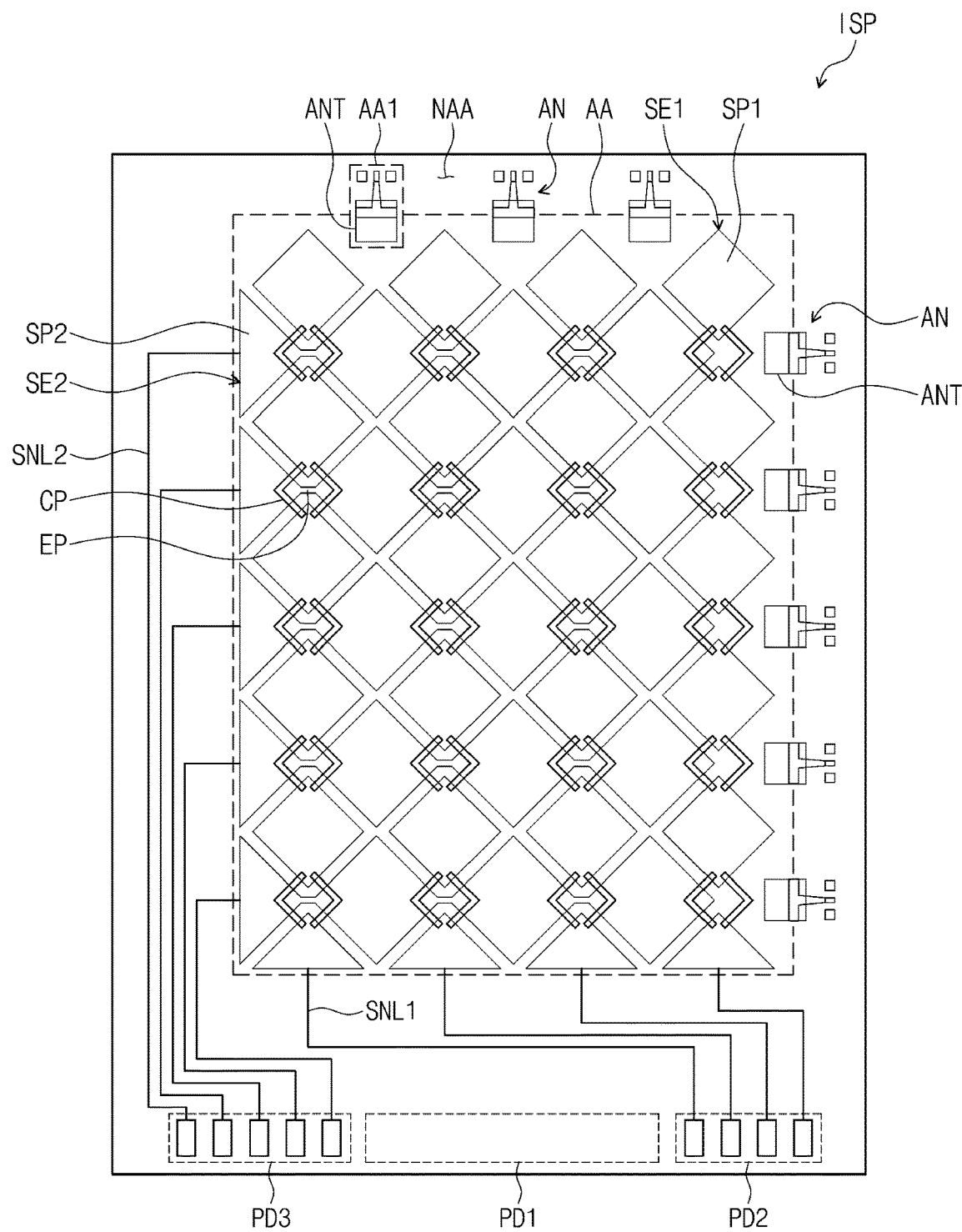
FIG. 6 is a plan view showing an input sensing unit shown in FIG. 2.

FIG. 6 is a plan view showing the input sensing unit ISP shown in FIG. 2.

Referring to FIG. 6, the input sensing unit ISP may include a plurality of sensing electrodes SE1 and SE2, a plurality of lines SNL1 and SNL2, a plurality of second and third pads PD2 and PD3, and an antenna AN. The sensing electrodes SE1 and SE2, the lines SNL1 and SNL2, the second and third pads PD2 and PD3, and the antenna AN may be disposed on the display panel DP. For example, the sensing electrodes SE1 and SE2, the lines SNL1 and SNL2, the second and third pads PD2 and PD3, and the antenna AN may be disposed on the thin film encapsulation layer TFE.

A flat area of the input sensing unit ISP may include an active area AA and a non-active area NAA proximate to and at least partially surrounding the active area AA. The active area AA may overlap the display area DA, and the non-active area NAA may overlap the non-display area NDA.

The sensing electrodes SE1 and SE2 may be disposed in the active area AA, and the second and third pads PD2 and PD3 may be disposed in the non-active area NAA. The second pads PD2 and the third pads PD3 may be disposed adjacent to a lower end of the input sensing unit ISP when viewed in a plane. The first pads PD1 may be disposed between the second pads PD2 and the third pads PD3 when viewed in a plane.

The lines SNL1 and SNL2 may be connected to one ends of the sensing electrodes SE1 and SE2, may extend to the non-active area NAA, and may be connected to the second and third pads PD2 and PD3. A sensing controller may be connected to the second and third pads PD2 and PD3 via a printed circuit board and may control the input sensing unit ISP.

The sensing electrodes SE1 and SE2 may include a plurality of first sensing electrodes SE1 extending in the first direction DR1 and arranged in the second direction DR2 and a plurality of second sensing electrodes SE2 extending in the second direction DR2 and arranged in the first direction DR1. The second sensing electrodes SE2 may be insulated from the first sensing electrodes SE1 while crossing the first sensing electrodes SE1.

The signal lines SNL1 and SNL2 may include a plurality of first signal lines SNL1 connected to the first sensing electrodes SE1 and a plurality of second signal lines SNL2 connected to the second sensing electrodes SE2. The first signal lines SNL1 may extend to the non-active area NAA and may be connected to the second pads PD2. The second signal lines SNL2 may extend to the non-active area NAA and may be connected to the third pads PD3.

As an example, the first signal lines SNL1 may be disposed in the non-active area NAA adjacent to a lower side of the active area AA when viewed in plane. In addition, the second signal lines SNL2 may be disposed in the non-active area NAA adjacent to a left side of the active area AA when viewed in plane.

Each of the first sensing electrodes SE1 may include a plurality of first sensing portions SP1 arranged in the first direction DR1 and a plurality of connection patterns CP connecting the first sensing portions SP1. Each of the connection patterns CP may be disposed between two first sensing portions SP1 adjacent to each other in the first direction DR1 and may connect the two first sensing portions SP1.

Each of the second sensing electrodes SE2 may include a plurality of second sensing portions SP2 arranged in the second direction DR2 and a plurality of extension patterns EP extending from the second sensing portions SP2. Each of the extension patterns EP may be disposed between two second sensing portions SP2 adjacent to each other in the second direction DR2 and may extend from the two second sensing portions SP2.

The first sensing portions SP1 might not overlap the second sensing portions SP2, may be spaced apart from the second sensing portions SP2, and may be alternately arranged with the second sensing portions SP2. A capacitance may be formed by the first sensing portions SP1 and the second sensing portions SP2. The extension patterns EP might not overlap the connection patterns CP.

The antenna AN may perform communication functions. The antenna AN may be disposed in the non-active area NAA in which the first and second signal lines SNL1 and SNL2 are not disposed. As an example, the antenna AN may be disposed in the non-active area NAA adjacent to an upper side of the active area AA and in the non-active area NAA adjacent to a right side of the active area AA when viewed in a plane. The antenna AN may overlap a boundary between the active area AA and the non-active area NAA.

The antenna AN may include a plurality of antenna patterns ANT disposed in the non-active area NAA adjacent to the upper side of the active area AA and in the non-active area NAA adjacent to the right side of the active area AA. The antenna patterns ANT may be arranged along an edge of the input sensing unit ISP. The antenna patterns ANT may overlap the boundary between the active area AA and the non-active area NAA.

The antenna patterns ANT may be spaced apart from the first and second sensing electrodes SE1 and SE2. The antenna patterns ANT may be electrically connected to an antenna driving IC chip via a flexible circuit board. The antenna patterns ANT is described in greater detail below.

The first and second sensing electrodes SE1 and SE2 and the antenna patterns ANT may include silver, gold, copper, aluminum, platinum, palladium, chromium, titanium, tungsten, niobium, tantalum, vanadium, iron, manganese, cobalt, nickel, zinc, tin, molybdenum, and/or alloys thereof.

Figure 7:
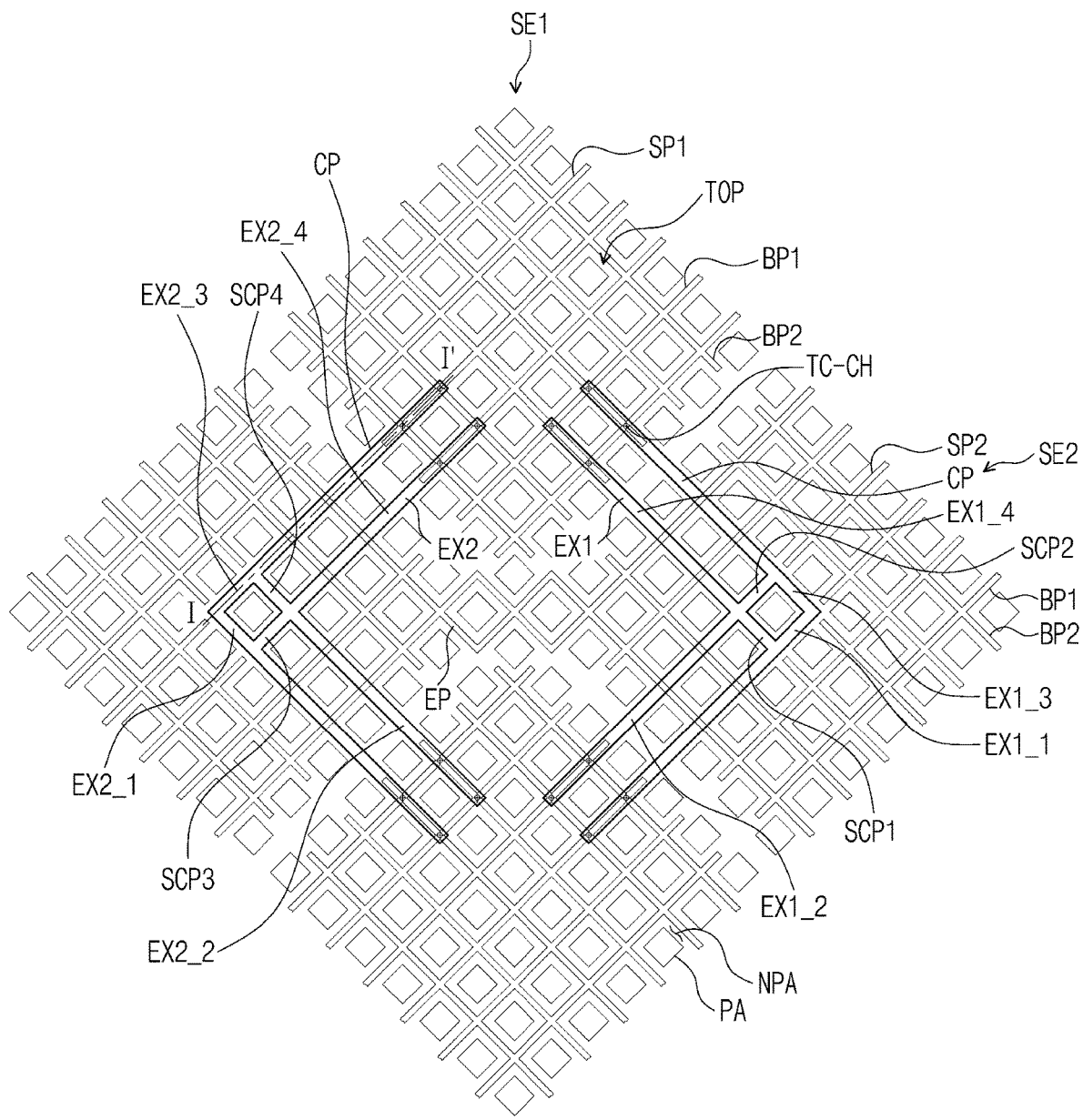
FIG. 7 is an enlarged plan view showing two first sensing portions adjacent to each other and two second sensing portions adjacent to each other shown in FIG. 6.
Figure 7:
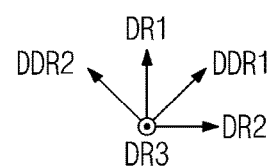

FIG. 7 is an enlarged plan view showing two first sensing portions SP1 adjacent to each other and two second sensing portions SP2 adjacent to each other shown in FIG. 6.

Referring to FIG. 7, the first sensing portions SP1 and the second sensing portions SP2 may have a mesh shape. Each of the first and second sensing portions SP1 and SP2 may include a plurality of first branch portions BP1 extending in a first diagonal direction DDR1 and a plurality of second branch portions BP2 extending in a second diagonal direction DDR2 and having the mesh shape.

The first diagonal direction DDR1 may be defined as a direction crossing the first and second directions DR1 and DR2 on the plane defined by the first and second directions DR1 and DR2. The second diagonal direction DDR2 may be defined as a direction crossing the first diagonal direction DDR1 on the plane defined by the first and second directions DR1 and DR2. As an example, the first direction DR1 and the second direction DR2 may be substantially perpendicular to each other, and the first diagonal direction DDR1 and the second diagonal direction DDR2 may be substantially perpendicular to each other.

The first branch portions BP1 of each of the first and second sensing portions SP1 and SP2 may cross the second branch portions BP2 of each of the first and second sensing portions SP1 and SP2 and may be integrally formed with the second branch portions BP2 of each of the first and second sensing portions SP1 and SP2. Touch openings TOP each having a lozenge (e.g., diamond or rhombus) shape may be defined by the first branch portions BP1 and the second branch portions BP2.

When viewed in a plane, the light emitting areas PA may be defined in the touch openings TOP. Each of the light emitting areas PA may be the light emitting area PA shown in FIG. 5. The first and second sensing portions SP1 and SP2 may be disposed in the non-light-emitting area NPA. Since the first and second sensing portions SP1 and SP2 are disposed in the non-light-emitting area NPA, the light generated in the light emitting areas PA may be normally emitted without being influenced by the first and second sensing portions SP1 and SP2.

The connection pattern CP may extend so as not to overlap the extension pattern EP and may connect the first sensing portions SP1. The connection pattern CP may be connected to the first sensing portions SP1 via a plurality of contact holes TC-CH. A structure of the contact holes TC-CH will be shown in FIG. 8. The connection pattern CP may extend to the first sensing portions SP1 via areas overlapping the second sensing portions SP2.

The extension pattern EP may be disposed between the first sensing portions SP1 and may extend from the second sensing portions SP2. The second sensing portions SP2 may be integrally formed with the extension pattern EP. The extension pattern EP may have the mesh shape. The extension pattern EP, the first sensing portions SP1, and the second sensing portions SP2 may be disposed on the same layer and may be formed by patterning the same material.

The connection pattern CP may include a first extension portion EX1 and a second extension portion EX2 having a shape symmetrical with that of the first extension portion EX1. The extension pattern EP may be disposed between the first extension portion EX1 and the second extension portion EX2. The first extension portion EX1 may extend via an area overlapping one second sensing portion SP2 among the second sensing portions SP2 and may be connected to the first sensing portions SP1. The second extension portion EX2 may extend via an area overlapping another second sensing portion SP2 among the second sensing portions SP2 and may be connected to the first sensing portions SP1.

Hereinafter, the first sensing portions SP1 may be defined as an upper first sensing portion SP1 and a lower first sensing portion SP1 according to a relative position. In addition, the second sensing portions SP2 may be defined as a left second sensing portion SP2 and a right second sensing portion SP2 according to a relative position.

Predetermined portions of the first and second extension portions EX1 and EX2, which are adjacent to one sides of the first and second extension portions EX1 and EX2, may be connected to the lower first sensing portion SP1 via the contact holes TC-CH. Predetermined portions of the first and second extension portions EX1 and EX2, which are adjacent to the other sides of the first and second extension portions EX1 and EX2, may be connected to the upper first sensing portion SP1 via the contact holes TC-CH.

The first extension portion EX1 may include a first sub-extension portion EX1_1 and a second sub-extension portion EX1_2, which extend in the first diagonal direction DDR1, a third sub-extension portion EX1_3 and a fourth sub-extension portion EX1_4, which extend in the second diagonal direction DDR2, a first sub-conductive pattern SCP1 extending in the second diagonal direction DDR2, and a second sub-conductive pattern SCP2 extending in the first diagonal direction DDR1.

Predetermined portions of the first and second sub-extension portions EX1_1 and EX1_2, which are adjacent to one sides of the first and second sub-extension portions EX1_1 and EX1_2, may be connected to the lower first sensing portion SP1 via the contact holes TC-CH. Predetermined portions of the third and fourth sub-extension portions EX1_3 and EX1_4, which are adjacent to one sides of the third and fourth sub-extension portions EX1_3 and EX1_4, may be connected to the upper first sensing portion SP1 via the contact holes TC-CH.

The other side of the first sub-extension portion EX1_1 may extend from the other side of the third sub-extension portion EX1_3, and the other side of the second sub-extension portion EX1_2 may extend from the other side of the fourth sub-extension portion EX1_4. The first sub-conductive pattern SCP1 may extend from the other side of the fourth sub-extension portion EX1_4 in the second diagonal direction DDR2 and may extend to the first sub-extension portion EX1_1. The second sub-conductive pattern SCP2 may extend from the other side of the second sub-extension portion EX1_2 in the first diagonal direction DDR1 and may extend to the third sub-extension portion EX1_3.

The first sub-extension portion EX1_1, the second sub-extension portion EX1_2, the third sub-extension portion EX1_3, the fourth sub-extension portion EX1_4, the first sub-conductive pattern SCP1, and the second sub-conductive pattern SCP2 may be integrally formed with each other.

The first and second sub-extension portions EX1_1 and EX1_2 may cross some second branch portions BP2 adjacent to the lower first sensing portion SP1 among the second branch portions BP2 of the right second sensing portion SP2. The first branch portions BP1 of the right second sensing portion SP2 might not be disposed in some areas overlapping the first and second sub-extension portions EX1_1 and EX1_2 and the second sub-conductive pattern SCP2.

The third and fourth sub-extension portions EX1_3 and EX1_4 may cross some first branch portions BP1 adjacent to the upper first sensing portion SP1 among the first branch portions BP1 of the right second sensing portion SP2. The second branch portions BP2 of the right second sensing portion SP2 might not be disposed in some areas overlapping the third and fourth sub-extension portions EX1_3 and EX1_4 and the first sub-conductive pattern SCP1.

The second extension portion EX2 may include a fifth sub-extension portion EX2_1 and a sixth sub-extension portion EX2_2, which extend in the second diagonal direction DDR2, a seventh sub-extension portion EX2_3 and an eighth sub-extension portion EX2_4, which extend in the first diagonal direction DDR1, a third sub-conductive pattern SCP3 extending in the first diagonal direction DDR1, and a fourth sub-conductive pattern SCP4 extending in the second diagonal direction DDR2.

The left second sensing portion SP2 may have a structure that is symmetrical with respect to the right second sensing portion SP2, and the second extension portion EX2 may have a structure that is symmetrical with respect to the first extension portion EX1. Accordingly, hereinafter, detailed descriptions of the fifth to eighth sub-extension portions EX2_1 to EX2_4 and the third and fourth sub-conductive patterns SCP3 and SCP4 will be omitted and may be assumed to be at least similar to corresponding elements described elsewhere within the present disclosure.

Figure 8:
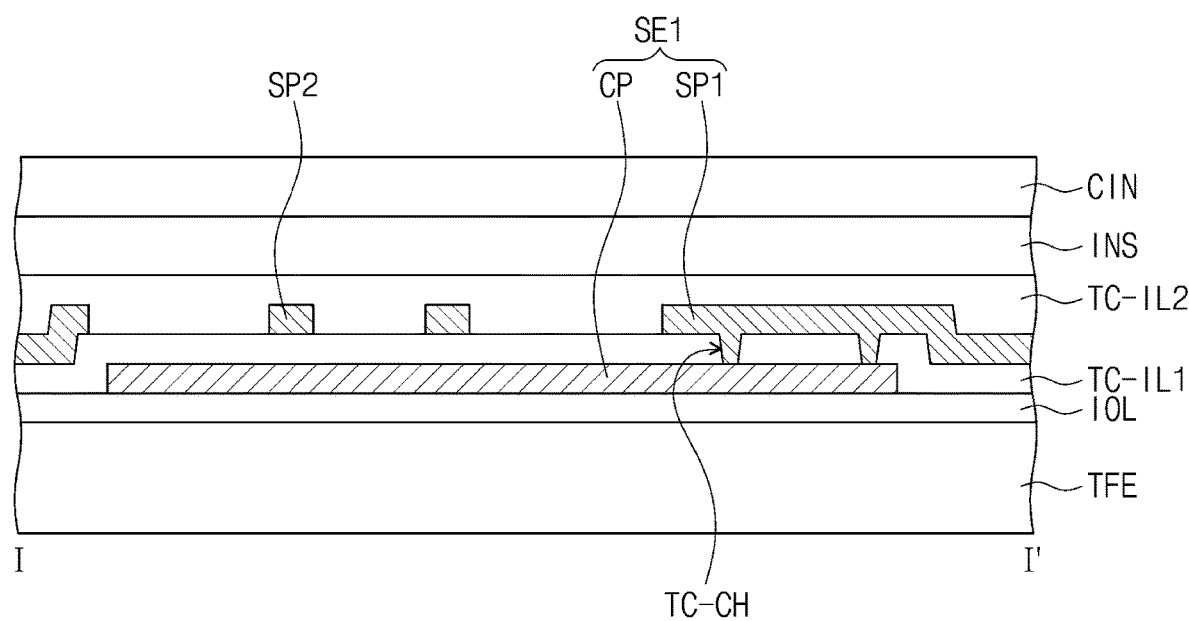
FIG. 8 is a cross-sectional view taken along a line I-I' shown in FIG. 7.

FIG. 8 is a cross-sectional view taken along a line I-I' shown in FIG. 7.

Referring to FIG. 8, an insulating layer IOL may be disposed on the thin film encapsulation layer TFE. The insulating layer IOL may include an inorganic insulating layer. At least one insulating layer IOL may be disposed on the thin film encapsulation layer TFE. As an example, two inorganic insulating layers IOL may be sequentially stacked on the thin film encapsulation layer TFE.

The connection pattern CP may be disposed on the insulating layer IOL. A first insulating layer TC-IL1 may be disposed on the connection pattern CP and the insulating layer IOL. The first insulating layer TC-IL1 may be disposed on the insulating layer IOL and may cover the connection pattern CP. The first insulating layer TC-IL1 may include an inorganic insulating layer or an organic insulating layer.

The first sensing portions SP1 and the second sensing portions SP2 may be disposed on the first insulating layer TC-IL1. The extension pattern EP integrally formed with the second sensing portions SP2 may also be disposed on the first insulating layer TC-IL1. The connection pattern CP may be connected to the first sensing portions SP1 via the contact holes TC-CH defined through the first insulating layer TC-IL1.

A second insulating layer TC-IL2 may be disposed on the first and second sensing portions SP1 and SP2 and the first insulating layer TC-IL1. The second insulating layer TC-IL2 may be disposed on the first insulating layer TC-IL1 and may cover the first sensing portions SP1 and the second sensing portions SP2. The second insulating layer TC-IL2 may include an organic insulating layer.

An insulating layer INS may be disposed on the second insulating layer TC-IL2. A cover insulating layer CIN may be disposed on the insulating layer INS. Each of the insulating layer INS and the cover insulating layer CIN may include an inorganic insulating layer or an organic insulating layer.

Figure 9:
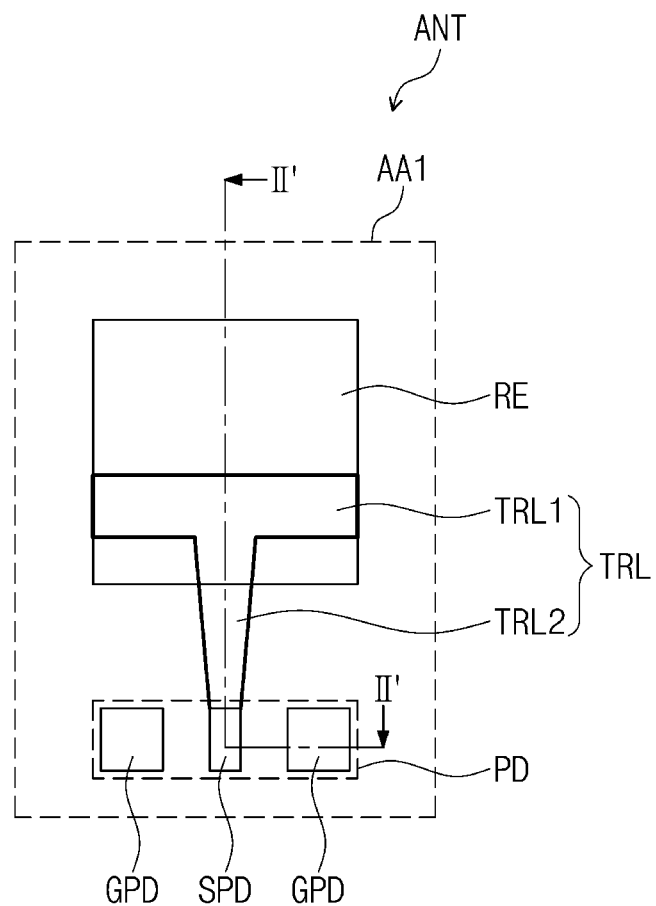
FIG. 9 is an enlarged view showing an antenna pattern disposed in a first area shown in FIG. 6.

FIG. 9 is an enlarged view showing the antenna pattern ANT disposed in a first area AA1 shown in FIG. 6.

As an example, the antenna pattern ANT disposed in the first area AA1 shown in FIG. 6 is shown in reverse with respect to the first direction DR1 in FIG. 9.

Referring to FIGS. 6 and 9, the antenna pattern ANT may include a radiation electrode RE, a transmission line TRL, and a pad PD. When viewed in a plane, the radiation electrode RE, the transmission line TRL, and the pad PD may be spaced apart from the first and second sensing electrodes SE1 and SE2. The radiation electrode RE may have a quadrangular shape, however, the shape of the radiation electrode RE should not necessarily be limited to the quadrangular shape.

The transmission line TRL may partially overlap the radiation electrode RE. As an example, when viewed in a plane, one portion of the transmission line TRL may overlap a portion of the radiation electrode RE, and the other portion of the transmission line TRL may extend outside of the radiation electrode RE so as not to overlap the radiation electrode RE. The transmission line TRL may extend outside of the radiation electrode RE and may be electrically connected to the pad PD.

The transmission line TRL may include a first transmission line TRL1 extending in one direction, e.g., the second direction DR2, and a second transmission line TRL2 extending in a direction crossing the one direction, e.g., the first direction DR1. For example the transmission line TRL may have a T-shape.

The first transmission line TRL1 may overlap the radiation electrode RE when viewed in a plane. A length of the first transmission line TRL1 in the second direction DR2 may be substantially the same as a length of the radiation electrode RE to maximize the overlapping area between the first transmission line TRL1 and the radiation electrode RE.

The second transmission line TRL2 may extend from a portion of the first transmission line TRL1 to the first direction DR1. As an example, the second transmission line TRL2 may extend from a center of the first transmission line TRL1 to the first direction DR1, however, it should not necessarily be limited thereto or thereby. According to an embodiment of the present disclosure, the second transmission line TRL2 may extend from various portions of the first transmission line TRL1 to the first direction DR1.

The second transmission line TRL2 may extend outside of the radiation electrode RE and may be electrically connected to the pad PD. A width of the second transmission line TRL2 in the second direction DR2 may decrease as a distance from the pad PD decreases, however, the shape of the second transmission line TRL2 should not necessarily be limited thereto or thereby.

The pad PD may be spaced apart from the radiation electrode RE in the first direction DR1. The pad PD may be electrically connected to the antenna driving IC chip via the above-mentioned flexible circuit board.

The pad PD may include a signal pad SPD electrically connected to the transmission line TRL and a plurality of ground pads GPD adjacent to the signal pad SPD. The signal pad SPD and the ground pads GPD may be disposed on the same layer and may be arranged in the second direction DR2. The signal pad SPD and the ground pads GPD may be spaced apart from the radiation electrode RE in the first direction DR1.

The signal pad SPD may be disposed between the ground pads GPD and may be electrically connected to the transmission line TRL. The second transmission line TRL2 may be electrically connected to the signal pad SPD. The ground pads GPD may be electrically insulated from the signal pad SPD and may be grounded.

Since a lowest ground resistance value possible may be desired, the larger the ground electrode, the better. Accordingly, it is desirable for the ground pads GPD to have a larger size, however, there may be restrictions on the size of the ground pads GPD as the area for the arrangement of the ground pads GPD is limited. When viewed in a plane, each of the ground pads GPD may have an area greater than an area of the signal pad SPD.

According to an embodiment of the present disclosure, a ground layer may be disposed under the antenna pattern ANT. A conductive member of the display panel DP may be provided as the ground layer. The conductive member may include, for example, a gate electrode of the transistor TR, various lines such as the scan lines SL1 to SLm or the data lines DL1 to DLm, and various electrodes such as the first electrode AE and the second electrode CE, which are included in the display panel DP.

A signal may be transmitted to the transmission line TRL via the signal pad SPD, and the signal may be transmitted to the radiation electrode RE via the transmission line TRL. The radiation electrode RE may radiate the signal.

As the ground pads GPD are substantially parallel to the signal pad SPD, a horizontal radiation may be practically implemented by the antenna pattern ANT. In addition, in a case where the above-mentioned ground layer is formed, a vertical radiation may also be practically implemented by the antenna pattern ANT.

Figure 10:
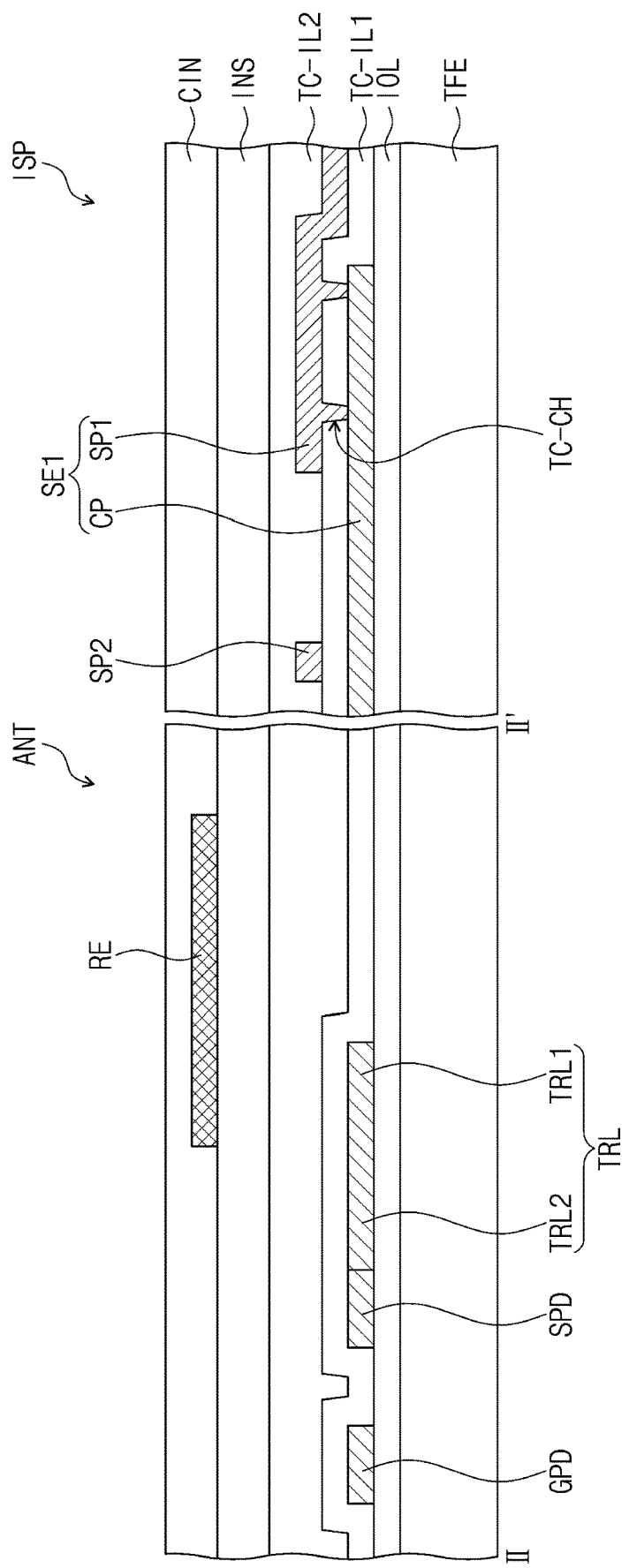
FIG. 10 is a cross-sectional view taken along a line II-II' shown in FIG. 9.

FIG. 10 is a cross-sectional view taken along a line II-IF shown in FIG. 9.

As an example, in FIG. 10, as a portion of the cross-section shown in FIG. 8, the first and second sensing portions SP1 and SP2 and the connection pattern CP are shown with the antenna pattern ANT.

Referring to FIGS. 9 and 10, the transmission line TRL, the signal pad SPD, and the ground pad GPD may be disposed on the thin film encapsulation layer TFE of the display panel DP. For example, the transmission line TRL, the signal pad SPD, and the ground pad GPD may be disposed on the insulating layer IOL. The transmission line TRL, the signal pad SPD, the ground pad GPD, and the connection pattern CP may be disposed on the same layer.

The transmission line TRL, the signal pad SPD, and the ground pad GPD may be spaced apart from the first and second sensing portions SP1 and SP2 and the connection pattern CP. The first insulating layer TC-IL1 may be disposed on the transmission line TRL, the signal pad SPD, and the ground pad GPD. The first insulating layer TC-IL1 may be disposed on the insulating layer IOL and may cover the transmission line TRL, the signal pad SPD, and the ground pad GPD.

The transmission line TRL may extend toward the signal pad SPD and may be electrically connected to the signal pad SPD. As an example, the second transmission line TRL2 may extend toward the signal pad SPD and may be electrically connected to the signal pad SPD. An end of the second transmission line TRL2 may be in contact with a side surface of the signal pad SPD to electrically connect the transmission line TRL to the signal pad SPD.

The second insulating layer TC-IL2 may be disposed on the first insulating layer TC-IL1, and the insulating layer INS may be disposed on the second insulating layer TC-IL2. The insulating layer INS may be disposed on the transmission line TRL, the signal pad SPD, the ground pad GPD, and the first and second sensing portions SP1 and SP2.

The radiation electrode RE may be separated from the transmission line TRL and may be disposed on the insulating layer INS. The radiation electrode RE may be disposed at a position that is higher than that of the first and second sensing portions SP1 and SP2.

The insulating layer INS may include an inorganic insulating material, such as silicon oxide, silicon nitride, or metal oxide. In addition, the insulating layer INS may include an organic insulating material, such as an epoxy-based resin, an acrylic-based resin, an amide-based resin, a cellulose-based resin, a polyolefin-based resin, a urethane-based resin, a vinyl alcohol-based resin, or the like.

The insulating layer INS may have a thickness of about 2 micrometers to about 200 micrometers and may have a permittivity of about 1.5 to about 12. The thin film encapsulation layer TFE may have a thickness of about 5 micrometers to about 50 micrometers.

The signal transmitted to the transmission line TRL, e.g., an alternating current signal having a predetermined frequency, may be transmitted to the radiation electrode RE through the transmission line TRL by an indirect feeding method. Although the transmission line TRL might not be directly connected to the radiation electrode RE, the signal may be transmitted to the radiation electrode RE from the transmission line TRL by a coupling phenomenon of a capacitor formed by the transmission line TRL and the radiation electrode RE overlapping the transmission line TRL.

A parasitic capacitance may be formed between the radiation electrode RE and the display panel DP. As an example, the parasitic capacitance may be formed by the radiation electrode RE and conductors of the display panel DP. In a case where the radiation electrode RE is disposed on the same layer as the transmission line TRL, the parasitic capacitance may increase since a distance between the radiation electrode RE and the display panel DP decreases. When the parasitic capacitance increases, a radiation efficiency and gain characteristics of the antenna AN may be deteriorated.

However, according to an embodiment of the present disclosure, the radiation electrode RE may be separated from the transmission line TRL and may be disposed on the insulating layer INS without being disposed on the same layer as the transmission line TRL. Accordingly, since the distance between the radiation electrode RE and the display panel DP increases, the parasitic capacitance may decrease. As a result, the radiation efficiency and the gain characteristics of the antenna AN may be increased.

FIGS. 11 to 20 are views showing antenna patterns ANT_1 to ANT_10 according to embodiments of the present disclosure.

Hereinafter, different configurations of the antenna patterns ANT_1 to ANT_10 shown in FIGS. 11 to 20 from those of the antenna pattern ANT shown in FIGS. 9 and 10 will be mainly described.

Figure 11:
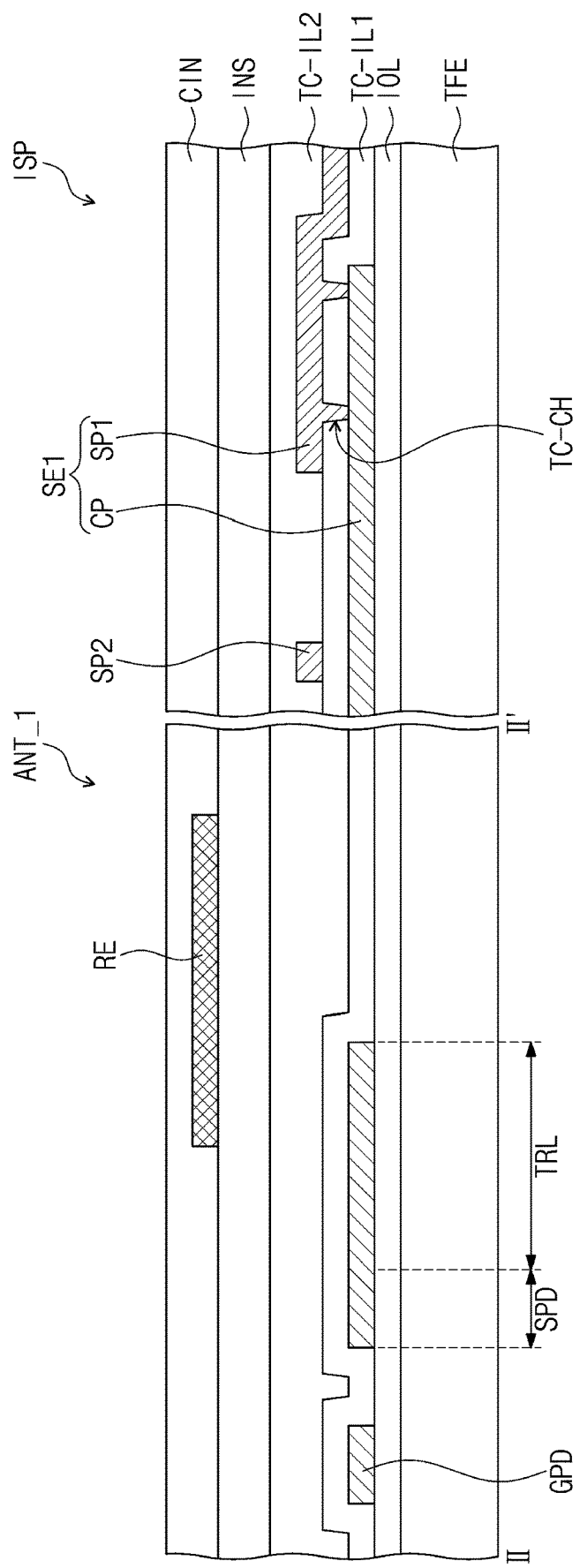
FIGS. 11 to 20 are views showing antenna patterns according to embodiments of the present disclosure.
Figure 12:
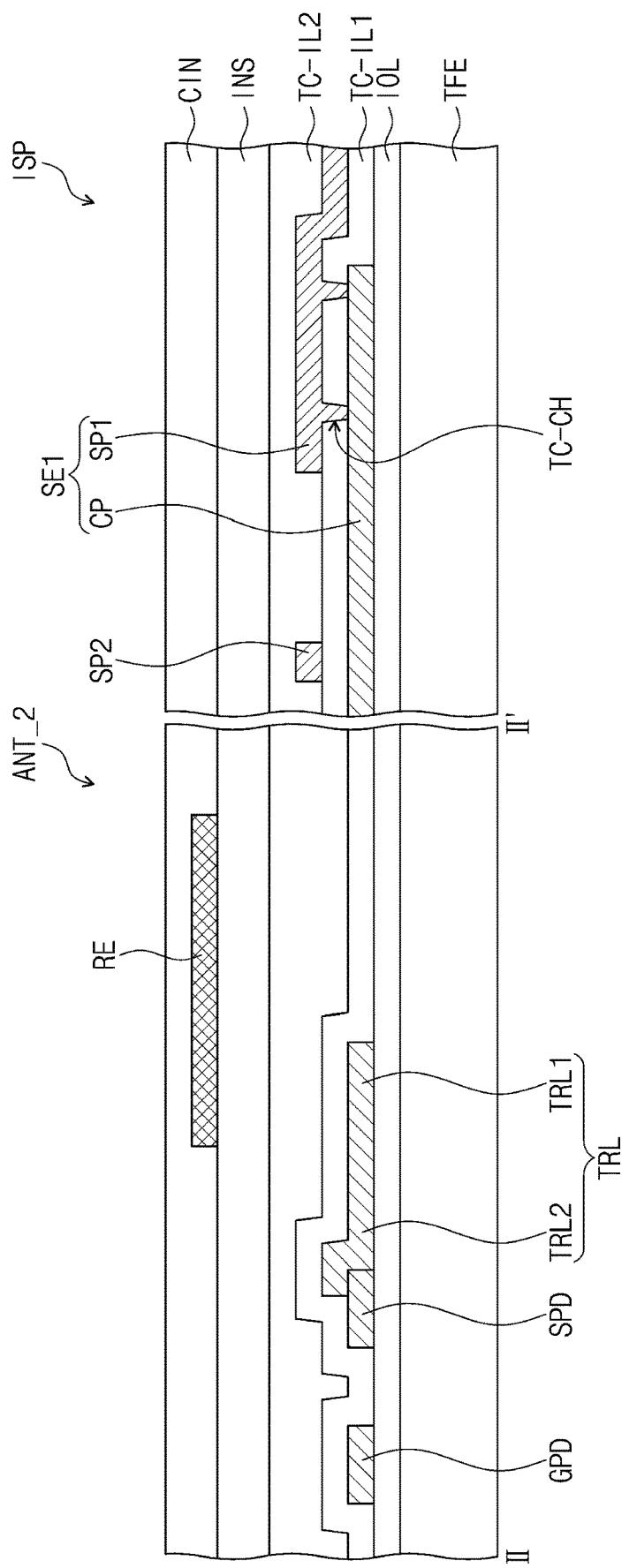
Figure 13:
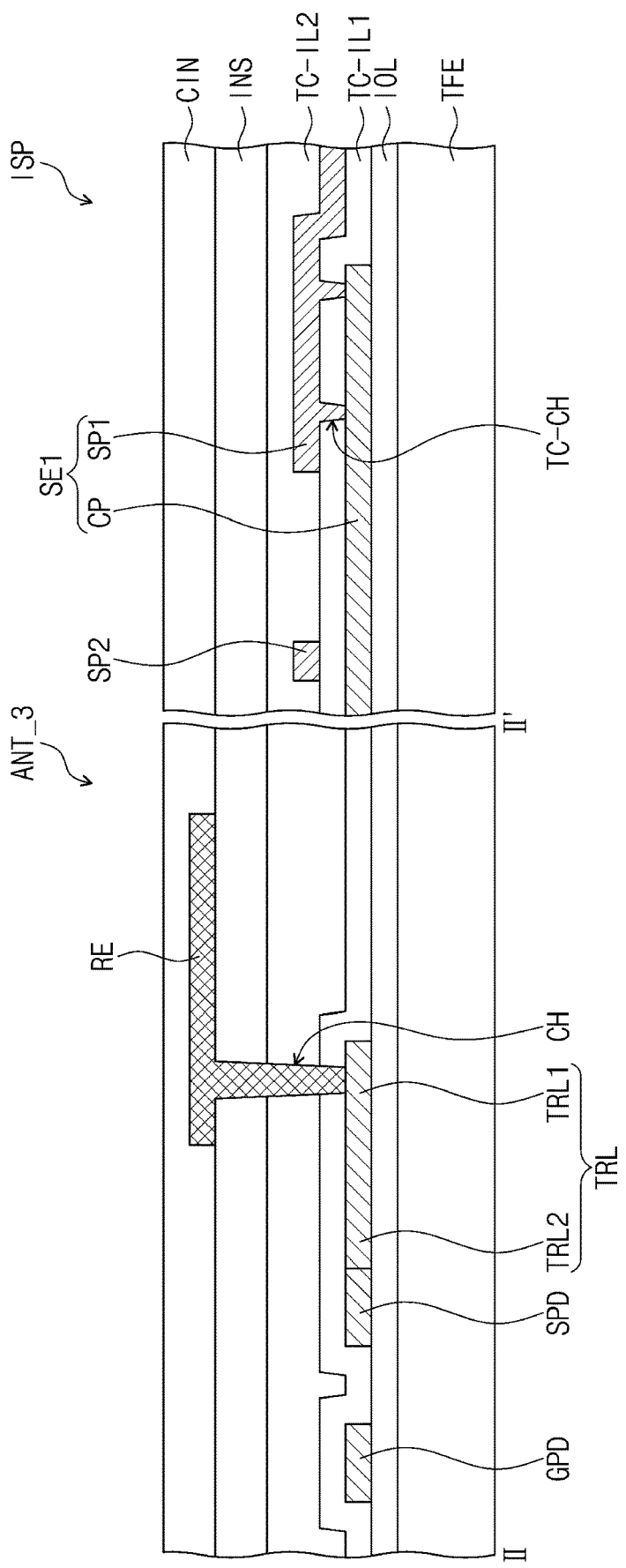

As an example, FIGS. 11 to 13 show cross-sections corresponding to that of FIG. 10, and FIGS. 14 to 20 show cross-sections corresponding to that of FIG. 9.

Referring to FIG. 11, different from the structure shown in FIG. 10, a transmission line TRL of the antenna pattern ANT_1 may be integrally formed with a signal pad SPD. The transmission line TRL and the signal pad SPD may be integrally formed with each other by patterning the same material.

Referring to FIG. 12, a portion of a second transmission line TRL2 of an antenna pattern ANT_2 may be disposed on at least a portion of an upper surface of a signal pad SPD and may make contact with at least the portion of the upper surface of the signal pad SPD. As the portion of the second transmission line TRL2 makes contact with at least the portion of the upper surface of the signal pad SPD, a transmission line TRL may be electrically connected to the signal pad SPD.

Referring to FIG. 13, a contact hole CH may be defined through an insulating layer INS, a second insulating layer TC-IL2, and a first insulating layer TC-IL1 to expose a portion of a first transmission line TRL1. As a radiation electrode RE of an antenna pattern ANT_3 makes contact with the first transmission line TRL1 via the contact hole CH, the radiation electrode RE may be electrically connected to a transmission line TRL.

Different from the structure shown in FIG. 10, the radiation electrode RE may be directly connected to the transmission line TRL. Accordingly, a signal applied to the transmission line TRL may be transmitted to the radiation electrode RE from the transmission line TRL by a direct feeding method.

Figure 14:
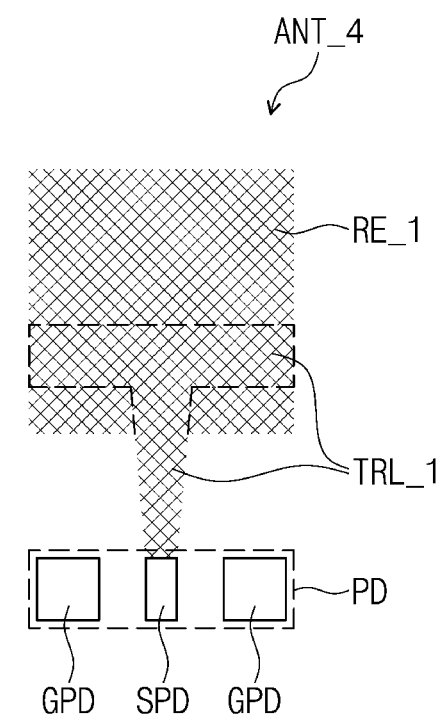
Figure 14:
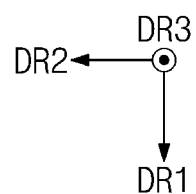

Referring to FIG. 14, a radiation electrode RE_1 and a transmission line TRL_1 of an antenna pattern ANT_4 may have a mesh shape. As an example, an edge of the transmission line TRL_1 overlapping the radiation electrode RE_1 is shown with a dotted line to distinguish the edge from the radiation electrode RE_1.

A light transmittance of the radiation electrode RE_1 and the transmission line TRL_1 may be increased due to openings having the mesh shape, and thus, the radiation electrode RE_1 and the transmission line TRL_1 might not be visible to a user. As an example, since a light transmits via the openings, the shape of the radiation electrode RE_1 and the transmission line TRL_1 might not be visible to a user.

Figure 15:
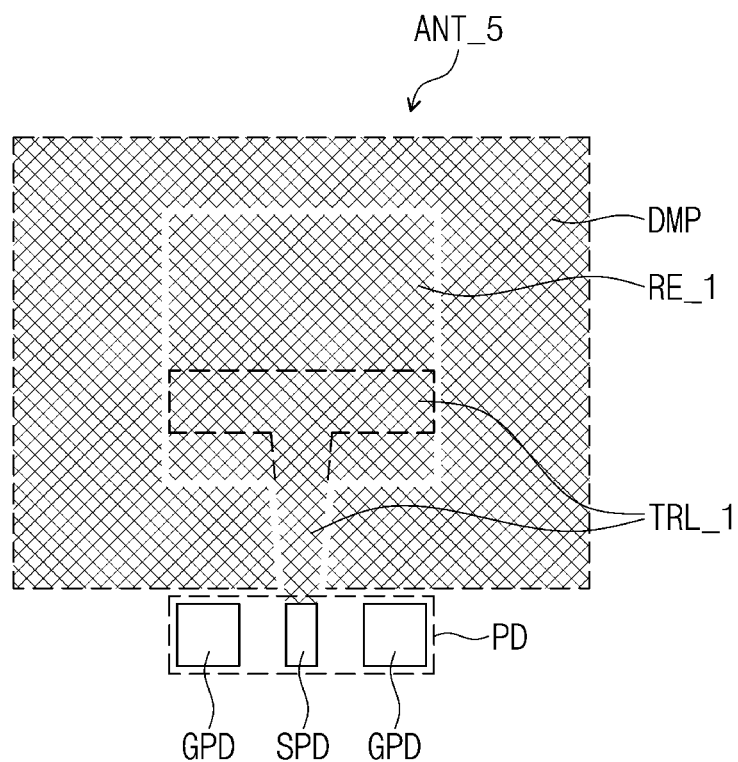

Referring to FIG. 15, a radiation electrode RE_1 and a transmission line TRL_1 of an antenna pattern ANT_5 may have a mesh shape. The antenna pattern ANT_5 may further include a dummy pattern DMP disposed around the radiation electrode RE_1 and the transmission line TRL_1. The dummy pattern DMP may be disposed in a non-active area NAA. The dummy pattern DMP may have a mesh shape in the same way that the radiation electrode RE_1 and the transmission line TRL_1 have the mesh shape.

The dummy pattern DMP having the mesh shape similar to that of the radiation electrode RE_1 and the transmission line TRL_1 may be disposed around the radiation electrode RE_1 and the transmission line TRL_1. In this case, since similar shapes are disposed adjacent to each other, a boundary of the radiation electrode RE_1 and the transmission line TRL_1 might not be recognized from the outside by the dummy pattern DMP.

Figure 16:
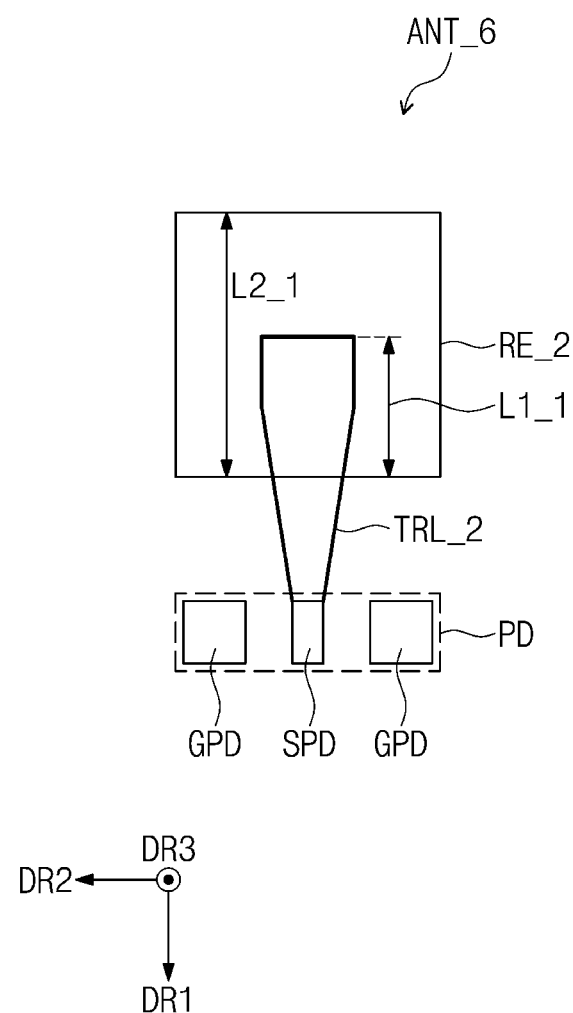

Referring to FIG. 16, a radiation electrode RE_2 of an antenna pattern ANT_6 may have a quadrangular shape, however, it should not necessarily be limited thereto or thereby. The radiation electrode RE_2 may have various other polygonal shapes. A transmission line TRL_2 partially overlapping a radiation electrode RE_2 may extend in one direction, e.g., the first direction DR1, and may be connected to a signal pad SPD.

Different from the embodiment of FIG. 9, the transmission line TRL_2 might not include a portion extending in the second direction DR2. A portion of the transmission line TRL_2 overlapping the radiation electrode RE_2 may have a length L1_1 that is greater than a half of a length L2_1 of the radiation electrode RE_2 in the first direction DR1.

Figure 17:
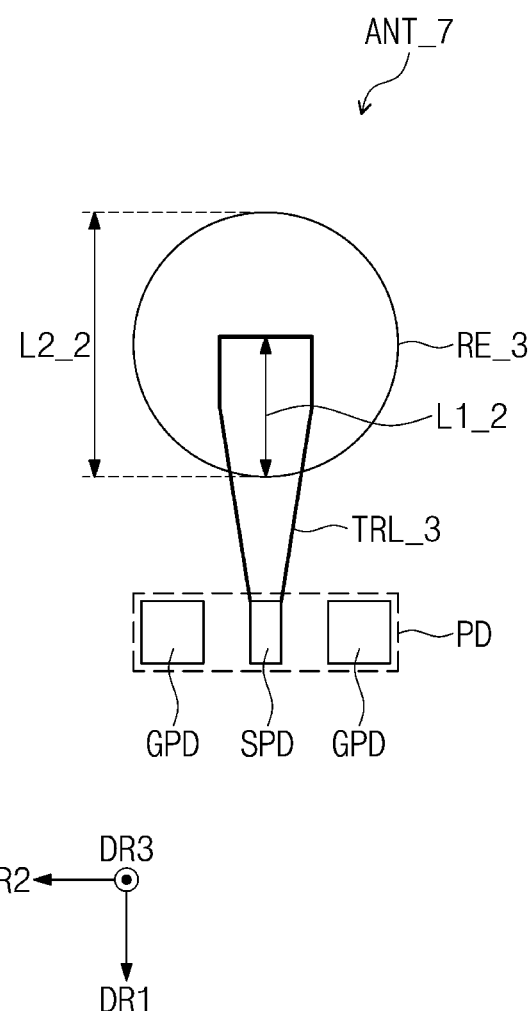

Referring to FIG. 17, a radiation electrode RE_3 of an antenna pattern ANT_7 may have a circular shape. A transmission line TRL_3 partially overlapping the radiation electrode RE_3 may extend in the first direction DR1 and may be connected to a signal pad SPD. A portion of the transmission line TRL_3, which overlaps the radiation electrode RE_3, may have a rectangular shape, however, it should not necessarily be limited thereto or thereby. According to an embodiment of the present disclosure, the portion of the radiation electrode RE_3 may have a variety of shapes, a circular shape, a polygonal shape, etc.

Different from the embodiment of FIG. 9, the transmission line TRL_3 might not include a portion extending in the second direction DR2. The portion of the transmission line TRL_3 overlapping the radiation electrode RE_3 may have a length L1_2 that is greater than a half of a length L2_2 of the radiation electrode RE_3 in the first direction DR1.

Figure 18:
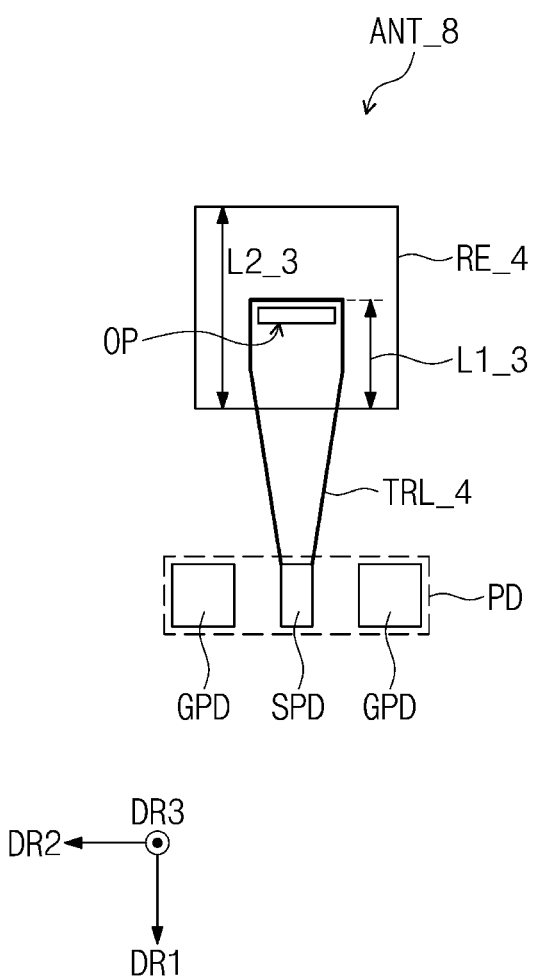

Referring to FIG. 18, a radiation electrode RE_4 of an antenna pattern ANT_8 may have a quadrangular shape, and a transmission line TRL_4 partially overlapping the radiation electrode RE_4 may extend in the first direction DR1 and may be connected to a signal pad SPD. Different from the embodiment of FIG. 9, the transmission line TRL_4 might not include a portion extending in the second direction DR2. A portion of the transmission line TRL_4 overlapping the radiation electrode RE_4 may have a length L1_3 that is greater than a half (½) of a length L2_3 of the radiation electrode RE_4 in the first direction DR1.

An opening OP may be defined through a portion of the radiation electrode RE_4 and a portion of the transmission line TRL_4, which overlap each other. The opening OP may be defined through the radiation electrode RE_4 and the transmission line TRL_4, however, the present disclosure should not necessarily be limited thereto or thereby. According to an embodiment of the present disclosure, the opening OP may be defined through only one of the radiation electrode RE_4 and the transmission line TRL_4. As the opening OP is defined, an area of the radiation electrode RE_4 and an area of the transmission line TRL_4 may be reduced, and a light transmittance may be increased.

Figure 19:
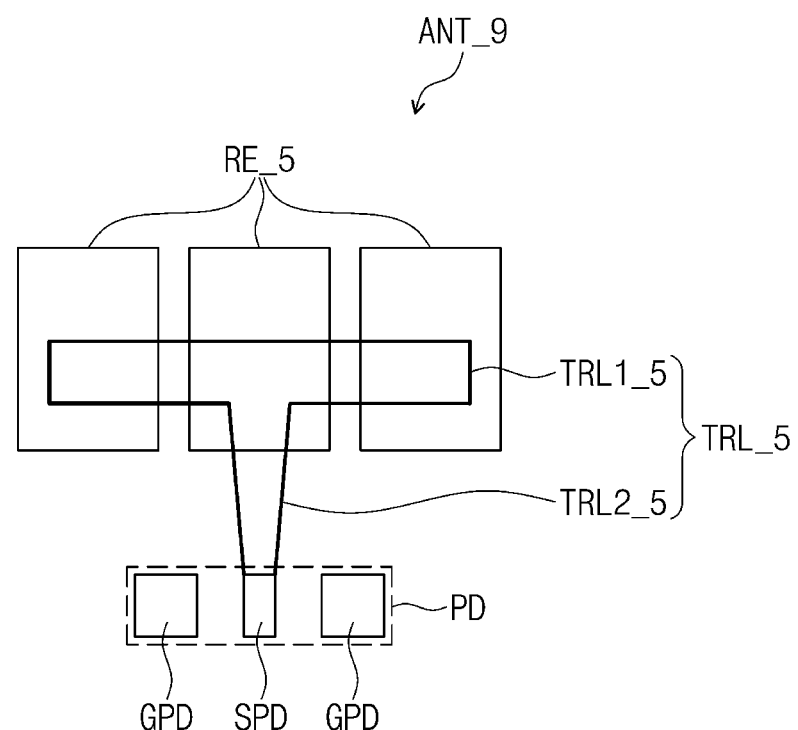

Referring to FIG. 19, an antenna pattern ANT_9 may include a plurality of radiation electrodes RE_5 and a transmission line TRL_5. The radiation electrodes RE_5 may be arranged in the second direction DR2. The transmission line TRL_5 may overlap portions of the radiation electrodes RE_5.

The transmission line TRL_5 may include a first transmission line TRL1_5 extending in the second direction DR2 and a second transmission line TRL2_5 extending in the first direction DR1 from the from the first transmission line TRL1_5. The first transmission line TRL1_5 may overlap the radiation electrodes RE_5, and the second transmission line TRL2_5 may be connected to a signal pad SPD.

Figure 20:
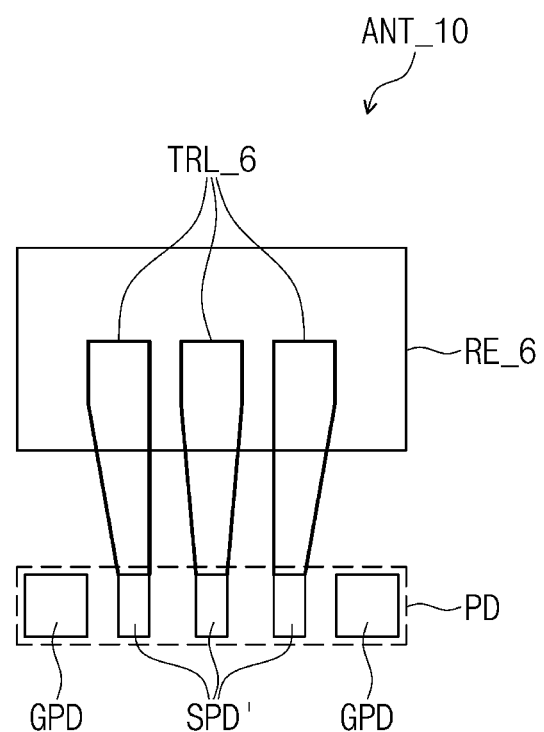

Referring to FIG. 20, the antenna pattern ANT_10 may include a radiation electrode RE_6 and a plurality of transmission lines TRL_6. The transmission lines TRL_6 may be arranged in the second direction DR2 and may extend in the first direction DR1. Portions of the transmission lines TRL_6 may overlap the radiation electrode RE_6. The transmission lines TRL_6 may be respectively connected to a plurality of signal pads SPD'.

Table 1 below shows example test values for the antenna patterns ANT, ANT_4, ANT_6, ANT_7, and ANT_8 respectively shown in FIGS. 9, 14, 16, 17 and 18.

The tests on the antenna patterns may be performed with a resonant frequency of 28 GHz or a resonant frequency approximately of 28 GHz. For example, some data may be obtained with a slight deviation in the resonant frequency around 28 GHz. However, these errors may be determined to be within an allowable tolerance.

TABLE 1

|  | Resonant Frequency [GHz] | Bandwidth [GHz] | Gain [dBi] | Radiation efficiency | Size of radiation electrode |
|---|---|---|---|---|---|
| Comparative example | 28.00 | 0.95 | 3.00 | 41.1 | 4.8 |
| FIG. 9 | 28.00 | 1.15 | 5.75 | 63.0 | 3.6 |
| FIG. 14 | 28.45 | 1.28 | 4.86 | 54.2 | 3.0 |

TABLE 1-continued

|  | Resonant Frequency [GHz] | Bandwidth [GHz] | Gain [dBi] | Radiation efficiency | Size of radiation electrode |
|---|---|---|---|---|---|
| FIG. 16 | 28.10 | 0.82 | 5.71 | 61.8 | 3.6 |
| FIG. 17 | 27.55 | 1.10 | 5.49 | 60.0 | 3.5 |
| FIG. 18 | 28.05 | 0.52 | 4.48 | 48.3 | 2.5 |

In Table 1, the comparative example indicates a structure in which the radiation electrode and the transmission line are disposed on the same layer. As an example, in the comparative example, the radiation electrode and the transmission line are integrally formed with each other and are disposed on the insulating layer IOL, and the first insulating layer TC-IL1 may be disposed on the radiation electrode and the transmission line. In Table 1, "size of radiation electrode" may indicate a length of the larger one between a horizontal length and a vertical length of the radiation electrode.

Referring to Table 1, in the antenna patterns ANT, ANT_4, ANT_6, ANT_7, and ANT_8 respectively shown in FIGS. 9, 14, 16, 17, and 18, the size of the radiation electrodes may be reduced compared with that of the comparative example, but the gain and the radiation efficiency of the radiation electrodes may increase compared with those of the comparative example. For example, according to the embodiments of the present disclosure in which the radiation electrode and the transmission line are separated from each other and the insulating layer is disposed between the radiation electrode and the transmission line, the gain and the radiation efficiency increase, and thus, the performance of the antenna patterns ANT, ANT_4, ANT_6, ANT_7, and ANT_8 is increased.

In addition, according to the antenna patterns ANT, ANT_4, and ANT_7 respectively shown in FIGS. 9, 14, and 17, a frequency bandwidth increases compared with the comparative example. For example, according to some embodiments in which the radiation electrode is separated from the transmission line and the insulating layer is disposed between the radiation electrode and the transmission line, the frequency bandwidth increases, and thus, the performance of the antenna patterns ANT, ANT_4, and ANT_7 may be increased.

Although various embodiments of the present disclosure have been described, it is understood that the present disclosure should not necessarily be limited to these embodiments but various changes and modifications can be made by one ordinary skilled in the art within the spirit and scope of the present disclosure.

What is claimed is:
1. A display device, comprising:
a display panel;
a sensing electrode disposed on the display panel;
a transmission line disposed on the display panel and spaced apart from the sensing electrode;
an insulating layer disposed on both the sensing electrode and the transmission line; and
a radiation electrode disposed on the insulating layer,
wherein a portion of the transmission line overlaps a portion of the radiation electrode, and
wherein the insulating layer electrically separates the transmission line from the radiation electrode such that the transmission line does not directly contact the radiation electrode.

2. The display device of claim 1, further comprising:
a signal pad spaced apart from the radiation electrode, disposed on a same layer as the transmission line, and electrically connected to the transmission line; and
a ground pad spaced apart from the radiation electrode, disposed on a same layer as the transmission line, and disposed adjacent to the signal pad.

3. The display device of claim 2, wherein the ground pad has an area that is greater than an area of the signal pad.

4. The display device of claim 2, wherein the transmission line comprises:
a first transmission line extending in a first direction and overlapping the radiation electrode; and
a second transmission line extending from a portion of the first transmission line in a second direction crossing the first direction and electrically connected to the signal pad.

5. The display device of claim 4, wherein an end of the second transmission line makes contact with a side surface of the signal pad.

6. The display device of claim 4, wherein a portion of the second transmission line is disposed on at least a portion of an upper surface of the signal pad and makes contact with at least the portion of the upper surface of the signal pad.

7. The display device of claim 2, wherein the transmission line and the signal pad constitute a single integrated structure.

8. The display device of claim 1, wherein the radiation electrode is electrically connected to the transmission line via a contact hole defined through the insulating layer.

9. The display device of claim 1, wherein the sensing electrode comprises:
a connection pattern disposed on the display panel; and
sensing portions disposed on the connection pattern and connected to each other through the connection pattern,
wherein the transmission line is disposed on a same layer as the connection pattern.

10. The display device of claim 9, further comprising:
a first insulating layer disposed on both the transmission line and the connection pattern; and
a second insulating layer disposed on the first insulating layer and covering the sensing portions disposed on the first insulating layer,
wherein the insulating layer is disposed on the second insulating layer.

11. The display device of claim 1, wherein the insulating layer comprises an inorganic insulating material or an organic insulating material.

12. The display device of claim 1, wherein the insulating layer has a thickness of about 2 micrometers to about 200 micrometers and has a permittivity of about 1.5 to about 12.

13. The display device of claim 1, wherein the display panel comprises:
a display element layer; and
a thin film encapsulation layer disposed on the display element layer,
wherein the thin film encapsulation layer has a thickness of about 5 micrometers to about 50 micrometers.

14. The display device of claim 1, wherein the transmission line and the radiation electrode each have a mesh shape.

15. The display device of claim 14, further comprising a dummy pattern disposed around both the transmission line and the radiation electrode and having a mesh shape.

16. The display device of claim 1, wherein the transmission line extends in a first direction, and the portion of the transmission line, which overlaps the portion of the radiation electrode, is greater than a half (½) of a length of the radiation electrode in the first direction.

17. The display device of claim 1, wherein the portion of the radiation electrode and the portion of the transmission line, which overlap each other, have an opening defined therethrough.

18. The display device of claim 1, wherein the radiation electrode is provided in plural, and the portion of the transmission line overlaps portions of the plurality of radiation electrodes.

19. The display device of claim 1, wherein the transmission line is provided in plural, and portions of the plurality of transmission line overlap the portion of the radiation electrode.

20. A display device, comprising:
a display panel;
a sensing electrode disposed on the display panel;
a transmission line disposed on the display panel and spaced apart from the sensing electrode;
an insulating layer disposed on both the sensing electrode and the transmission line; and
a radiation electrode disposed on the insulating layer,
wherein the transmission line comprises:
a first transmission line extending in a first direction and overlapping the radiation electrode; and
a second transmission line extending along a second direction crossing the first direction from a portion of the first transmission line to outside of the radiation electrode,
wherein the first transmission line has a length that is equal to a length of the radiation electrode in the first direction, and
wherein the insulating layer electrically separates the transmission line from the radiation electrode such that the transmission line does not directly contact the radiation electrode.

* * * * *